(12) United States Patent
Chaplik

(10) Patent No.: US 6,677,815 B1
(45) Date of Patent: Jan. 13, 2004

(54) SECOND ORDER ACTIVE RC FILTER WITH IMAGINARY ZERO

(75) Inventor: Naom Chaplik, San Diego, CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/245,177

(22) Filed: Sep. 17, 2002

Related U.S. Application Data

(60) Provisional application No. 60/390,428, filed on Jun. 19, 2002.

(51) Int. Cl.[7] .................................................. H03B 1/00
(52) U.S. Cl. ...................................................... 327/556
(58) Field of Search .................................. 327/551, 552, 327/556, 557

(56) References Cited

U.S. PATENT DOCUMENTS 6,201,438 B1 * 3/2001 Nicollini et al. ............. 327/558
6,226,322 B1 * 5/2001 Mukherjee .................. 375/229

* cited by examiner

*Primary Examiner*—Jeffrey Zweizig
(74) *Attorney, Agent, or Firm*—W. James Brady, III; Frederick J. Telecky, Jr.

(57) ABSTRACT

A stop band second order active RC filter architecture that does not use a non-inverting input to receive an input signal, and that employs both positive and negative feedback to provide an RC transfer function having an imaginary zero.

9 Claims, 1 Drawing Sheet

SECOND ORDER ACTIVE RC FILTER WITH IMAGINARY ZERO

This application claims priority under 35 USC §119(e)(1) of provisional application Serial. No. 60/390,428, filed Jun. 19, 2002.

BACKGROUND OF THE INVENTION

1. Field of the Invention

This invention relates generally to active RC filters, and more particularly to a stop band second order active RC filter that does not use a non-inverting input to receive an input signal, and that employs both positive and negative feedback to provide an imaginary zero associated with the RC filter transfer function.

2. Description of the Prior Art

All known stop band (transfer function with an imaginary zero) second order active RC filters with one operational amplifier are based on a non-inverting operational amplifier (Op Amp) with a limited gain. A non-inverting differential amplifier (Op Amp) must employ negative feedback, in which the non-inverting input of the Op Amp is used to provide a positive gain. Using an Op Amp inverting input to provide a stop band second order active RC filter is problematic however, since it increases the complexity of the Op Amp.

Many stop band second order active RC filters are known in the art. One stop band second order active RC filter that is well known in the prior art is illustrated in FIG. 1 described more fully by Claude S. Linquist, *Active Network Design, Steward & Sons*, 1977, pg 586.

It is therefore both advantageous and desirable in view of the foregoing, to provide a stop band second order active RC filter architecture that does not use a non-inverting input to receive an input signal and that employs both positive and negative feedback to provide an RC filter transfer function having an imaginary zero.

SUMMARY OF THE INVENTION

The present invention is directed to a stop band second order active RC filter architecture that does not use a non-inverting input to receive an input signal, and that employs both positive and negative feedback to provide an RC transfer function having an imaginary zero.

According to one embodiment, a stop band second order active RC filter comprises a single operational amplifier (Op Amp), wherein the single Op Amp has an inverting input, a non-inverting input, and an output; and a plurality of filter elements including a plurality of resistors and a plurality of capacitors, wherein at least one predetermined filter element selected from among the plurality of resistors and plurality of capacitors is configured to provide a positive feedback path between the Op Amp output and the Op Amp inverting input, and further wherein at least one predetermined filter element selected from among the plurality of resistors and plurality of capacitors is configured to provide a negative feedback path between the Op Amp output and the Op Amp inverting input, and further wherein the Op Amp does not use the non-inverting input to provide a stop band second order active RC filter transfer function having an imaginary zero.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawing figures wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
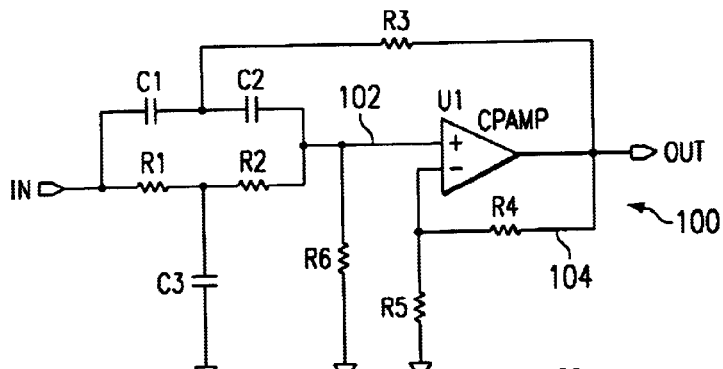
FIG. 1 is a schematic diagram illustrating a well-known stop band second order active RC filter that uses a non-inverting input and negative feedback to provide an imaginary zero associated with the RC filter transfer function.

FIG. 1 is a schematic diagram illustrating a well-known stop band second order active RC filter 100 that uses a non-inverting input 102 and negative feedback 104 to provide an imaginary zero associated with the RC filter transfer function. The stop band second order active RC filter 100 has a transfer function defined by the relationship written as $$T(s) = \frac{(3.83721 \cdot 10^{-12} \cdot s^2 + 1)}{(5.08615 \cdot 10^{-13} \cdot s^2 + 5.84088 \cdot 10^{-7} \cdot s + 1)}$$

Figure 2:
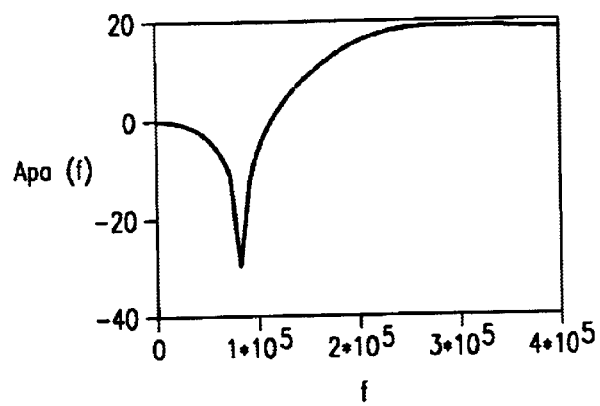
FIG. 2 illustrates the frequency performance of the stop band second order active RC filter shown in FIG. 1.

Using the circuit architecture shown in FIG. 1, and a frequency range defined by f=10·10³, 20·10³, ..., 400·10³, the component values associated with RC filter 100 necessary to implement transfer function T(s) were calculated by Linquist in the reference cited herein before as follows:

$\Omega := 2 \cdot \pi \cdot f;$ $Q := \frac{\sqrt{A2}}{A1};$ $Q = 1.221;$ $\frac{A2}{B2} = 0.13255;$ $C := 1 \cdot 10^{-9};$ $R4 := 10 \cdot 10^3;$ $RC := \sqrt{B2};$ $\rho := \left[\left(\frac{B2}{A2}\right) - 1\right] \cdot 0.5 = 3.27221;$ $R := \frac{RC}{C};$ $C1 := C \cdot 1;$ -continued $C2 := C \cdot 1;$ $C3 := 2 \cdot C \cdot 1;$ $R1 := R;$ $R2 := R;$ $R3 := \dfrac{R}{2};$ $B2pa := (R \cdot C)^2;$ $Kpa := -\left[\left(\dfrac{A1}{2 \cdot R \cdot C}\right) - 2 - \rho\right];$ $A2pa := \dfrac{(R \cdot C)^2}{1 + 2 \cdot \rho};$ $A1pa := 2 \cdot (2 + \rho - Kpa) \cdot R \cdot C;$ $R6 := \dfrac{R}{\rho};$ $R5 := \dfrac{R4}{Kpa};$ $Kpa = 5.12313;$ $C1 = 1 \times 10^{-9};$ $C2 = 1 \times 10^{-9};$ $C3 = 2 \times 10^{-9};$ $R3 = 979.43989;$ $R4 = 10000;$ $R5 = 1951.93269;$ $R3 = 979.43989;$ $R1 = 1958.87978;$ $R2 = 1958.87978;$ and $R6 = 598.64035.$ The frequency response for RC filter 100 using the above calculated values was also calculated by Linquist in the reference cited herein before as follows:

$TPA(f) := KPA \cdot \dfrac{[B2PA \cdot (\Omega \cdot f)^2 + 1]}{A2PA \cdot (\Omega \cdot f)^2 + A1PA \cdot \Omega \cdot f + 1};$ $APA(f) := 20 \cdot \log\left(\left|\dfrac{TPA(f)}{TPA(0)}\right|\right)$ FIG. 2 then shows a plot of APA(f) versus frequency f to illustrate the frequency performance of RC filter 100.

Figure 3:
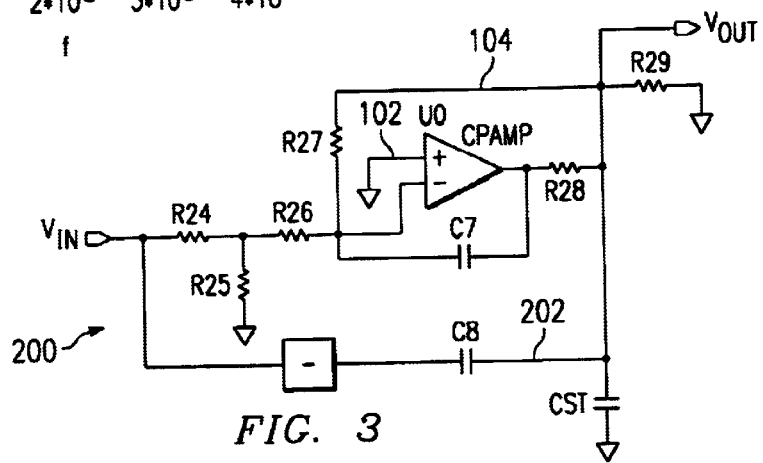
FIG. 3 is a schematic diagram illustrating a stop band second order active RC filter according to one embodiment of the present invention and that does not use a non-inverting input to receive an input signal and that employs both positive and negative feedback to provide an RC filter transfer function having an imaginary zero.

FIG. 3 is a schematic diagram illustrating a stop band second order active RC filter 200 according to one embodiment of the present invention and that does not use a non-inverting input 102 to receive an input signal, and that employs both positive feedback 202 and negative feedback 104 to provide an RC filter transfer function having an imaginary zero. The stop band second order active RC filter 200 has a transfer function defined by the relationship written as $T(s) = k \dfrac{[B2 \cdot (s^2) + 1]}{A2 \cdot s^2 + A1 \cdot s + 1},$ where -continued $\alpha = \dfrac{Re}{Re + R24}, K = \alpha \dfrac{R27}{R26}, Re = \dfrac{(R26 \cdot R25)}{R26 + R25},$ $B2 = C8 \cdot C7 \cdot R28 \cdot R26 \cdot \dfrac{1}{\alpha}, A2 = (C8 + Ct) \cdot R27 \cdot R28,$ and $A1 = C7\left[R27 + R28\left(1 + \dfrac{R27}{R29}\right)\right].$ A direct comparison can now be made between the prior art active RC filter 100 and the active RC filter 200 simply by setting the coefficients A1, A2, and B2 equal to the corresponding transfer function T(s) constants associated with active RC filter 100. Then, A2:=$5,08615 \cdot 10^{-13}$, A1:=$5.84088 \cdot 10^{-7}$, and B2:= $3.83721 \cdot 10^{-12}$ to provide $T(s) = \dfrac{(3.83721 \cdot 10^{-12} \cdot s^2 + 1)}{5.08615 \cdot 10^{-13} \cdot s^2 + 5.84088 \cdot 10^{-7} \cdot s + 1}$ for active RC filter 200.

The component values associated with RC filter 200 necessary to implement its transfer function T(s) above can be calculated as follows:

First, R26, R24, C8, γ, and L are given such that R26:= 35000, R24:=10000, C8:=$5.90909 \cdot 10^{-11}$, Ct:=$0.2 \cdot C8$, γ:=1.28, and L:=1.4. Then, $C7 := \dfrac{C8}{4 \cdot Ql^2 \cdot \gamma};$ $A := \dfrac{A2}{(C8 + Ct) \cdot C7};$ $B := \dfrac{A1}{C7};$ $R27 := \dfrac{\lfloor B + \sqrt{B^2 - 4 \cdot A \cdot (1 + L)} \rfloor}{2};$ $R29 := \dfrac{R27}{L};$ $R28 := \dfrac{A2}{(C8 + Ct) \cdot C7 \cdot R27};$ $D := \left(\dfrac{B2}{C8 \cdot C7 \cdot R28}\right);$ $\beta := \dfrac{R26}{D};$ $P := \beta \cdot \dfrac{R24}{1 - \beta} = R25 \cdot \dfrac{R26}{R25 + R26};$ and $R25 := P \cdot \dfrac{R26}{R26 - P}.$ The component values associated with RC filter 200 are then calculated according to the above relationships to be

R27=59020.90435;

R29=42157.78882;

R24=10000;

R28=24529.24282;

C7=$4.95447 \times 10^{-12}$;

Ct=$1.18182 \times 10^{-11}$; and

C8=$5.90909 \times 10^{-11}$.

Figure 4:
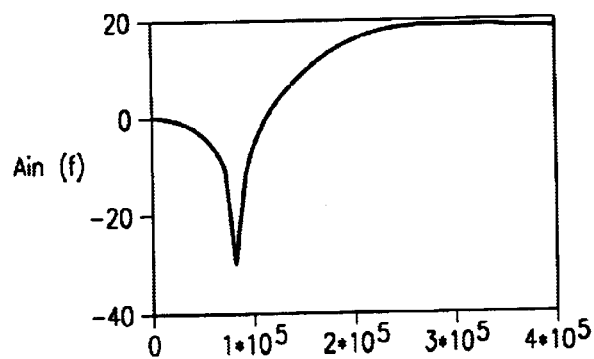
FIG. 4 illustrates the frequency performance of the stop band second order active RC filter shown in FIG. 3.

FIG. 4 then shows a plot of Ain(f) versus frequency f to illustrate the frequency performance of RC filter 200. A comparison of the frequency performance between RC filter 100 and RC filter 200 shows that RC filter 200 performs equally well without using the non-inverting input 102 to provide an RC filter transfer function having an imaginary zero.

In view of the above, it can be seen the present invention presents a significant advancement in the art of "second order active RC filtering" techniques. Further, this invention has been described in considerable detail in order to provide those skilled in the active filter art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A stop band second order active RC filter comprising a single operational amplifier (Op Amp) having an inverting input, a non-inverting input, and an output, wherein the Op Amp is configured to use only the inverting input to receive an input signal to provide a transfer function associated with the stop band second order active RC filter having an imaginary zero.

2. The stop band second order active RC filter according to claim 1 further comprising a plurality of filter elements including a plurality of resistors and a plurality of capacitors, wherein at least one predetermined filter element selected from among the plurality of resistors and plurality of capacitors is configured to provide a positive feedback path between the Op Amp output and the Op Amp inverting input, and further wherein at least one predetermined filter element selected from among the plurality of resistors and plurality of capacitors is configured to provide a negative feedback path between the Op Amp output and the Op Amp inverting input.

3. The stop band second order active RC filter according to claim 1 wherein the transfer function is defined by a relationship written as $$T(s) = k\frac{[B2 \cdot (s^2) + 1]}{A2 \cdot s^2 + A1 \cdot s + 1},$$

where $$\alpha = \frac{Re}{Re + R24}, K = \alpha\frac{R27}{R26}, Re = \frac{(R26 \cdot R25)}{R26 + R25},$$

$$B2 = C8 \cdot C7 \cdot R28 \cdot R26 \cdot \frac{1}{\alpha}, A2 = (C8 + Ct) \cdot R27 \cdot R28, \text{ and}$$

$$A1 = C7\left[R27 + R28\left(1 + \frac{R27}{R29}\right)\right].$$

4. A stop band second order active RC filter comprising:
a single operational amplifier (Op Amp) having an inverting input, a non-inverting input, and an output, wherein the Op Amp is configured to use only the inverting input to receive an input signal to provide a transfer function associated with the stop band second order active RC filter having an imaginary zero; and
a plurality of filter elements including a plurality of resistors and a plurality of capacitors,
wherein at least one predetermined filter element selected from among the plurality of resistors and plurality of capacitors is configured to provide a positive feedback path between the Op Amp output and the Op Amp inverting input, and further wherein at least one predetermined filter element selected from among the plurality of resistors and plurality of capacitors is configured to provide a negative feedback path between the Op Amp output and the Op Amp inverting input.

5. The stop band second order active RC filter according to claim 4 wherein the transfer function is defined by a relationship written as $$T(s) = k\frac{[B2 \cdot (s^2) + 1]}{A2 \cdot s^2 + A1 \cdot s + 1},$$

where $$\alpha = \frac{Re}{Re + R24}, K = \alpha\frac{R27}{R26}, Re = \frac{(R26 \cdot R25)}{R26 + R25},$$

$$B2 = C8 \cdot C7 \cdot R28 \cdot R26 \cdot \frac{1}{\alpha}, A2 = (C8 + Ct) \cdot R27 \cdot R28, \text{ and}$$

$$A1 = C7\left[R27 + R28\left(1 + \frac{R27}{R29}\right)\right].$$

6. A stop band second order active RC filter comprising:
a single operational amplifier (Op Amp) having an inverting input, a non-inverting input, and an output, wherein the Op Amp is configured to use only the inverting input to receive an input signal to provide a transfer function associated with the stop band second order active RC filter having an imaginary zero; and means for providing a positive feedback path between the Op Amp output and the Op Amp inverting input; and means for providing a negative feedback path between the Op Amp output and the Op Amp inverting input.

7. The stop band second order active RC filter according to claim 6 wherein the transfer function is defined by a relationship written as $$T(s) = k\frac{[B2 \cdot (s^2) + 1]}{A2 \cdot s^2 + A1 \cdot s + 1},$$

where $$\alpha = \frac{Re}{Re + R24}, K = \alpha\frac{R27}{R26}, Re = \frac{(R26 \cdot R25)}{R26 + R25},$$

$$B2 = C8 \cdot C7 \cdot R28 \cdot R26 \cdot \frac{1}{\alpha}, A2 = (C8 + Ct) \cdot R27 \cdot R28, \text{ and}$$

$$A1 = C7\left[R27 + R28\left(1 + \frac{R27}{R29}\right)\right].$$

8. The stop band second order active RC filter according to claim 6 wherein the means for providing a positive feedback path between the Op Amp output and the Op Amp inverting input comprises at least one capacitor.

9. The stop band second order active RC filter according to claim 6 wherein the means for providing a negative feedback path between the Op Amp output and the Op Amp inverting input comprises at least one resistor.

* * * * *